United States Patent
Brabec et al.

(10) Patent No.: US 7,180,075 B2
(45) Date of Patent: Feb. 20, 2007

(54) X-RAY DETECTOR INCLUDING A SCINTILLATOR WITH A PHOTOSENSOR COATING, AND A PRODUCTION PROCESS

(75) Inventors: Christoph Brabec, Erlangen (DE); Bjoern Heismann, Erlangen (DE); Juergen Leppert, Forchheim (DE); Thomas Von Der Haar, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 248 days.

(21) Appl. No.: 10/667,523

(22) Filed: Sep. 23, 2003

(65) Prior Publication Data

US 2004/0113088 A1 Jun. 17, 2004

(30) Foreign Application Priority Data

Sep. 23, 2002 (DE) ................................ 102 44 178

(51) Int. Cl.
*G01T 1/20* (2006.01)
(52) U.S. Cl. ............................................... 250/370.11
(58) Field of Classification Search ........... 250/370.11, 250/370.09, 363.01, 363.02, 363.03, 363.04, 250/363.05, 363.06, 363.07, 363.08, 363.09, 250/363.1
See application file for complete search history.

(56) References Cited

U.S. PATENT DOCUMENTS

| | | | | |
|---|---|---|---|---|
| 4,242,221 A | * | 12/1980 | Cusano et al. ............. | 264/1.21 |
| 5,454,880 A | * | 10/1995 | Sariciftci et al. ........... | 136/263 |
| 5,506,409 A | * | 4/1996 | Yoshida et al. ............. | 250/368 |
| 6,133,574 A | | 10/2000 | Blendinger ............ | 250/370.11 |
| 6,373,061 B1 | * | 4/2002 | Deutscher .................... | 250/367 |
| 6,420,031 B1 | * | 7/2002 | Parthasarathy et al. .. | 428/411.1 |
| 6,693,296 B1 | * | 2/2004 | Tyan ........................... | 257/40 |
| 2002/0182111 A1 | * | 12/2002 | Feygin .................... | 422/82.05 |
| 2003/0122083 A1 | * | 7/2003 | Possin et al. .......... | 250/370.11 |

FOREIGN PATENT DOCUMENTS

| | | |
|---|---|---|
| EP | 1291676 A2 | 7/2002 |
| WO | 99/09603 | 2/1999 |
| WO | 99/39335 | 8/1999 |

OTHER PUBLICATIONS

Tetsuhiko Takahashi, Haruo Itoh, Toshikazu Shimada, and Hiroshi Takeuchi, "Design of Integrated Radiation Detectors with a -Si Photodiodes on Ceramic Scintillators for use in X-Ray Computed Tomography", IEEE Transactions on Nuclear Science; vol. 37, No. 3, Jun. 9, 1990, p. 1478-1482.

* cited by examiner

*Primary Examiner*—David Porta
*Assistant Examiner*—Christopher Webb
(74) *Attorney, Agent, or Firm*—Harness, Dickey & Pierce, P.L.C.

(57) ABSTRACT

An X-ray detector is for a CT device and includes a phosphor layer for generating electromagnetic radiation as a function of the occurrence of X-radiation, and a photodetector layer for detecting the electromagnetic radiation generated by the phosphor layer. The phosphor layer includes ceramic material and the photodetector layer includes organic material. A process is further for producing an X-ray detector, including the steps of producing a phosphor layer from a ceramic material and applying a photodetector layer made from an organic material to the phosphor layer via a spinning, printing or beam/jet process or by sticking it on as a film. It is optionally possible to provide a further process step for polishing the surface of the phosphor layer before applying the photodetector layer.

34 Claims, 3 Drawing Sheets

X-RAY DETECTOR INCLUDING A SCINTILLATOR WITH A PHOTOSENSOR COATING, AND A PRODUCTION PROCESS

The present application hereby claims priority under 35 U.S.C. §119 on German patent application number DE 102 44 178.2 filed Sep. 23, 2002, the entire contents of which are hereby incorporated herein by reference.

BACKGROUND OF THE INVENTION

Electronic image detectors are increasingly being used in X-ray diagnostics. Whereas even nowadays in particular individual images are still frequently recorded using X-ray-sensitive film material, particularly in the case of series of X-ray pictures it is desirable to use electronic image detectors. These firstly allow faster image sequences to be taken, on account of the shorter exposure times required and the absence of mechanical film movement, and secondly allow the recorded data to be fed directly for electronic analysis. For example, in computer tomography (CT), series of thousands of individual images have to be combined to form an overall image, e.g. a tomogram.

Electronic image detectors which are composed of a scintillator and an adjoining photodiode are often used. The photodiode supplies, as an output signal, an analog current which is proportional to the measured X-ray intensity. An A/D converter converts this current into a digital value to be fed to an analysis computer, for example as an individual pixel of an X-ray image.

X-ray images are composed of a multiplicity of pixels which have to be generated by patterning the photodiode. Each pixel is formed by the output signal from an individually patterned photodiode, which is fed to the analysis computer via in each case a dedicated measurement channel. A dedicated electrical line with its own contacts has to be provided for each measuring channel. Contact is made via contact surfaces which serve as bonding pads. Therefore, a dedicated photodiode, a measuring channel and a bonding pad, which are arranged on the surface of the image detector, are required for each pixel.

To allow X-ray images of suitable quality to be recorded, it is necessary to use image detectors with the maximum possible area and the finest possible resolution, i.e. multi-pixelated image detectors with well over 10,000 pixels. The large number of conductor tracks, contact surfaces and connections entails a high level of outlay on patterning. At the same time, a high degree of integration has to be achieved in order not to have to use an excessively large proportion of the surface of the image detector for the measuring channel lines and bonding pads. This is because this proportion of the surface has to be regarded as an insensitive dead zone of the detector surface.

Although real image detector concepts which achieve a sufficiently high degree of integration to ensure a sufficiently fine image resolution with small detector dead zones despite the problems described are known, these concepts, e.g. what are known as FD image detectors based on amorphous silicon (a-Si) or what are known as semiconductor detectors, are complex and expensive to produce and pattern. Moreover, they have a pronounced persistence, which is responsible for inadequate time recording dynamics, which is unacceptable in particular for CT image detectors. Moreover, on account of the production process, in which scintillator and photodiode are produced separately from one another as inflexible, rigid layers and are then adhesively bonded to one another, they have poor optical properties. The adhesively bonded optical transition between the layers, which are not positioned optimally on account of the lack of flexibility, has a reduced optical transparency, which has adverse effects on the absorption efficiency of the image detector. Moreover, it causes reflections and refractions, causing crosstalk between pixelated structured image detectors.

An image detector which is less complex and less expensive to produce is disclosed in WO 99/09603. This is predicated on the use of an organic photodiode as an inexpensive alternative, which can be produced without difficulty over a large area, to inorganic-based detectors. Although organic photodiodes have time recording dynamics which are sufficient for X-ray pictures, without the aid of phosphors they are insufficiently sensitive to X-radiation to be used as X-ray detectors in X-ray image detectors. Therefore, the proposed detector has only a very limited scope for use as a CT X-ray detector.

SUMMARY OF THE INVENTION

An object of an embodiment of the invention is to provide a large-area X-ray detector for a CT device with sufficient X-ray sensitivity to record X-ray images which has good time recording dynamics for X-ray pictures and good measuring channel separation and at the same time is easy and inexpensive to produce and pattern. A further object of the invention is to provide an easy and inexpensive process for producing an X-ray detector of this type for a CT device.

An embodiment of the invention can achieve an object via an X-ray detector and via a production process.

One basic idea of an embodiment of the invention includes an X-ray detector for a CT device having a phosphor layer for generating electromagnetic radiation as a function of the occurrence of X-radiation, and having a photodetector layer for detecting the electromagnetic radiation generated by the phosphor layer. The phosphor layer may include a ceramic material, and the photodetector layer may be joined to the phosphor layer and include organic material. A layer structure of this type can be produced with layers which bear optimally against one another, ensuring excellent optical transition properties between the layers. Organic photodetectors are inexpensive, easy to process and also ensure a high detection sensitivity and good time detection dynamics.

In an advantageous configuration of the X-ray detector, an intermediate layer is arranged between the phosphor layer and the photodetector layer and is joined to the phosphor layer and to the photodetector layer. The intermediate layer is used, inter alia, to improve the mechanical bonding between ceramic phosphor layer and organic photodetector layer, which is fundamentally critical.

A further basic idea of an embodiment of the invention resides in providing a process for producing an X-ray detector for a CT device having a phosphor layer for generating electromagnetic radiation as a function of the occurrence of X-radiation, and having an organic photodetector layer for detecting the electromagnetic radiation generated by the phosphor layer. It further may include the process steps of producing a phosphor layer from a ceramic material and applying a photodetector layer made from an organic material to the phosphor layer by way of a spinning, printing or beam/jet process or by sticking it on as a film.

The application of the organic photodetector layer to the phosphor layer as a stable mechanical base by way of printing, beam/jet or film-bonding processes is easy and inexpensive to implement.

In a further configuration of the process, there is a further process step of polishing the surface of the phosphor layer before applying the photodetector layer. A smooth surface is of crucial import for the adhesion of the photodetector layer. Therefore, sufficient bonding can be ensured by sufficiently finely polishing the surface.

BRIEF DESCRIPTION OF THE DRAWINGS

The present invention will become more fully understood from the detailed description of preferred embodiments given hereinbelow and the accompanying drawings, which are given by way of illustration only and thus are not limitative of the present invention, and wherein.

DETAILED DESCRIPTION OF THE PREFERRED EMBODIMENTS

Figure 1:
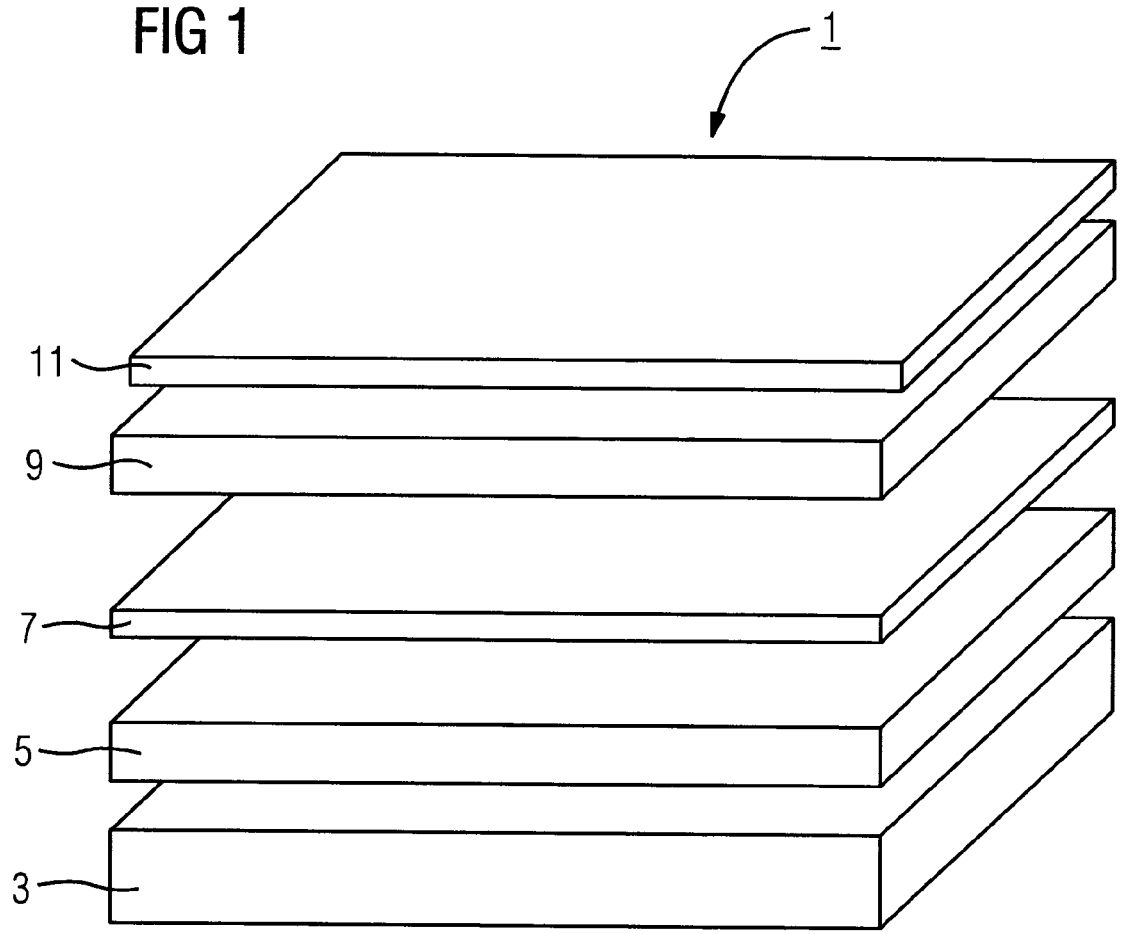
FIG. 1 shows an X-ray detector layer structure with an intermediate layer.

FIG. 1 shows the layer structure of an X-ray detector 1 for a CT device with an intermediate layer 7. For the sake of clarity, the layers are illustrated spaced apart from one another, but in reality are to be in direct contact with one another. Thus, in particular, the layers are not inherently rigid and can therefore bear optimally against one another. The layer structure is only diagrammatically illustrated. In particular, the figure does not illustrate any patterning or pixelation, since patterns of this type and the processes used to produce them do not form the subject of the present invention.

The layer structure is based on the combination of a phosphor layer 3 based on a ceramic scintillator material with a photodetector layer 9 based on an organic material.

Typical ceramic scintillator materials, e.g. $Gd_2O_2S$, $CdWO_4$, etc., may be used for the phosphor layer 3. Scintillator materials of this type are mechanically stable. This property is exploited by virtue of the fact that the phosphor layer 3 simultaneously serves as a mechanical base for the overall layer structure and imparts the mechanical stability required according to the particular application to this layer structure. In addition, it is used for the usual purpose of absorbing incident X-radiation and emitting it as electro-magnetic radiation of a different wavelength. The phosphor layer 3 is generally excited to generate visible light by incident X-radiation.

A bottom electrode 5 is arranged on the phosphor layer 3. The bottom electrode 5 inlcudes a material which is at least partially transparent to the radiation emitted by the phosphor layer 3. Moreover, the material must of course have a sufficient electrical conductivity. A conductive, transparent oxide, known as a transparent conducting oxide (TCO), is used. A material of this type, which is excellently able to satisfy the requirements set, is indium-doped tin oxide (ITO). The choice of an oxide as material for the bottom electrode 5 makes the latter particularly suitable for use as a positive electrode of the layer structure, since further oxidation of the material through the removal of electrons is of no importance.

Its layer thickness is selected as a function of the surface quality of the phosphor layer 3. It must be sufficient for a minimum layer thickness of the bottom electrode 5 to be obtained throughout, despite unevenness and elevations on the surface of the phosphor layer 3, in order to avoid peaks in the electrical field strength and short circuits at thin areas. The layer thickness is typically between 100 and 200 nm. The efficiency of the phosphor layer 3 is of crucial importance to the absorption efficiency of the X-ray detector with respect to X-radiation, since the latter first of all has to be converted by the phosphor layer 3 into a radiation which can be detected by the photodetector layer 9.

An intermediate layer 7 may be provided on the bottom electrode 5, in order to improve the surface quality of the bottom electrode 5 or the phosphor layer 3 below it and/or in order to compensate for any defects therein. The intermediate layer 7 has an excellent optical transparency and is positioned in such a way as to compensate for unevenness on the surface and thereby prevent points at which high electrical field strengths and short circuits may occur. Moreover, the planar surface of the intermediate layer 7 significantly improves the homogeneity of the photodetector layer 9 above it. To ensure a high optical transparency over and beyond the layer transition, a material whose refractive index is as similar as possible to the bottom electrode 5 is selected for the intermediate layer 7. As an alternative or in addition, it is also possible to select a material with a refractive index which is similar to the photodetector layer 9 which adjoins the intermediate layer 7 on the other side. In addition, the optical transparency is also improved by the high surface quality of the intermediate layer 7 itself.

Moreover, it is possible to widen the optical functionality of the intermediate layer 7 by integrating simple beam optics therein. By way of example, it is possible for simple, embossed lenses to be integrated into the intermediate layer 7 and for them to be used to suppress optical crosstalk between individual pixels of the X-ray detector 1 by promoting light collimation. In other words, the beams of the light within the individual pixels are bundled together and focused more strongly by the embossed lenses.

Furthermore, the intermediate layer 7 serves to improve the mechanical properties, in that it can significantly improve the adhesion of the photodetector layer 9 above it. The bonding of the organic photodetector layer 9 to the ceramic material of the phosphor layer 3 is critical and is decisively dependent on the surface quality of the ceramic. By contrast, the material selected for the intermediate layer 7 can be a material which on one side is able to ensure the less critical bonding to the ceramic phosphor layer 3 and on the other side is able to ensure good bonding of the organic photodetector layer 9. One example of a suitable material of this type is polyethylene-dioxy-thiophene (PEDOT) or polyethylene-dioxy-thiophene-polystyrene sulfonate (PEDOT-PSS). As an alternative, it is also possible, for example, to use polyaniline (P-ANI) or polypyrrole.

In addition, an intermediate layer 7 of this type can be used to improve the sensitivity of the layer structure by being designed as a selective electrical contact which effects optimum separation of the charge pairs which are generated in the photodetector layer 9 and as a result can be detected more successfully. Examples of materials which satisfy these requirements likewise include PEDOT or PEDOT-PSS, or alternatively P-ANI or polypyrrole. It is preferable for PEDOT-PSS which is highly doped in order to set suitable electrical properties to be selected as material for the intermediate layer 7. The layer thickness of the intermediate layer 7 is between 30 and 200 nm.

The photodetector layer 9 adjoins the bottom electrode 5 or, if present, the intermediate layer 7. It is preferable for the material selected for the photodetector layer 9 to be an organic photodiode, which can be produced, processed and also patterned without difficulty. The organic photodiode may, for example, consist of a mixture of p-type polymeric semiconductors, such as polyparaphenylene-vinylene (PPV), and n-type conjugated fullerenes, such as fullerene-phenyl-C61-butoxy-methoxine (fullerene-PCBM).

The material used for the organic photodetector layer 9 is selected in such a way that it absorbs the radiation emitted by the phosphor layer 3 as efficiently as possible and converts it into electrical charge carrier pairs. The layer thickness of the organic photodetector layer 9 is between 30 and 500 nm. It decisively influences the degree of absorption and therefore the efficiency of the X-ray detector, since the probability of absorption for radiation quanta increases with the length of the path which the radiation quanta have to cover through the photodetector layer 9. In addition to the layer thickness, the density and of course the material of the photodetector layer 9 itself also have a huge influence on the efficiency of absorption.

A top electrode 11 is arranged on the organic photodetector layer 9. Since the top electrode 11 ends the layer structure, it does not have to be transparent to the radiation which is to be detected. Instead, it may even have a reflecting action. This allows radiation quanta which have not been absorbed on their path through the photodetector layer 9 instead to be absorbed on their return path after reflection, in order to increase the absorption efficiency.

For the top electrode 11 it is preferable to select a metallic material, e.g. aluminum, a calcium-silver alloy or a lithium fluoride/aluminum alloy. If the top electrode 11 is not supposed to have a reflective action or if the layer structure is to be extended beyond the top electrode 11, it is preferably possible to select an organic material instead of the metallic material, for example a polyethylene-dioxy-thiophene (PEDOT) or a polyaniline (P-ANI). This can be integrated more flexibly in further layer sequences and can be joined more successfully to further layers. The layer thickness of the top electrode 11 is typically between 40 and 300 nm, although other layer thicknesses are also possible according to the particular requirements.

In a slightly modified embodiment of the X-ray detector 1 with intermediate layer 7, the layer sequence is altered in such a way that the ceramic phosphor layer 3 is followed firstly by the intermediate layer 7 and then the bottom electrode 5. In this embodiment, therefore, the order in the sequence of intermediate layer 7 and bottom electrode 5 is swapped over. The optical properties of the intermediate layer 7 in this case have to be matched without alteration to the surrounding layers and the wavelength of the light which is to be transmitted and has been generated by the phosphor layer 3. On the other hand, the advantage results that the electrical properties of the intermediate layer 7 in this layer sequence are virtually irrelevant, since neither current nor voltage have to be able to pass to the phosphor layer 3. This increases the flexibility in terms of the choice of materials for the intermediate layer 7. Moreover, in this way the intermediate layer 7 forms a smooth surface even for the bottom electrode 5, so that a uniform layer thickness can be maintained more easily and as a result more constant electrical properties are established.

Figure 2:
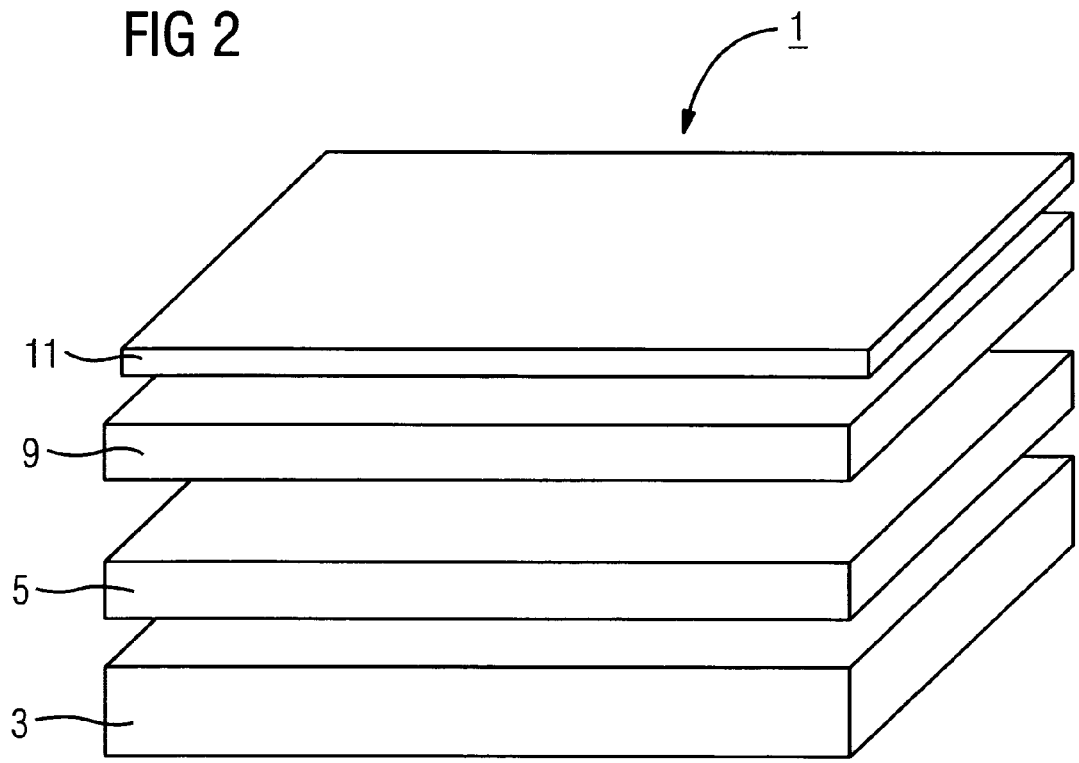
FIG. 2 shows an X-ray detector layer structure without an intermediate layer.

FIG. 2 shows a layer structure for an X-ray detector 1 without an intermediate layer. Otherwise, the layer structure illustrated corresponds to that which has been described in the previous figure. To this extent, the same reference numerals are used as in the previous figure and reference is also made to the associated description.

On account of the absence of an intermediate layer, the surface of the ceramic phosphor layer 3 has to be such that good bonding of the organic photodetector layer 9 to it is ensured. For this purpose, the surface of the phosphor layer 3 is primarily designed to be as smooth as possible, which is achieved inter alia by polishing. Compared to the phosphor layer 3, the bottom electrode 5 does not make a crucial contribution to improving the surface quality, meaning that above all the surface of the phosphor layer 3 has to be smooth. The smooth surface effects a uniform layer thickness of the bottom electrode 5 above it and of the photodetector layer 9, leading to more homogenous electrical and detection properties.

Figure 3:
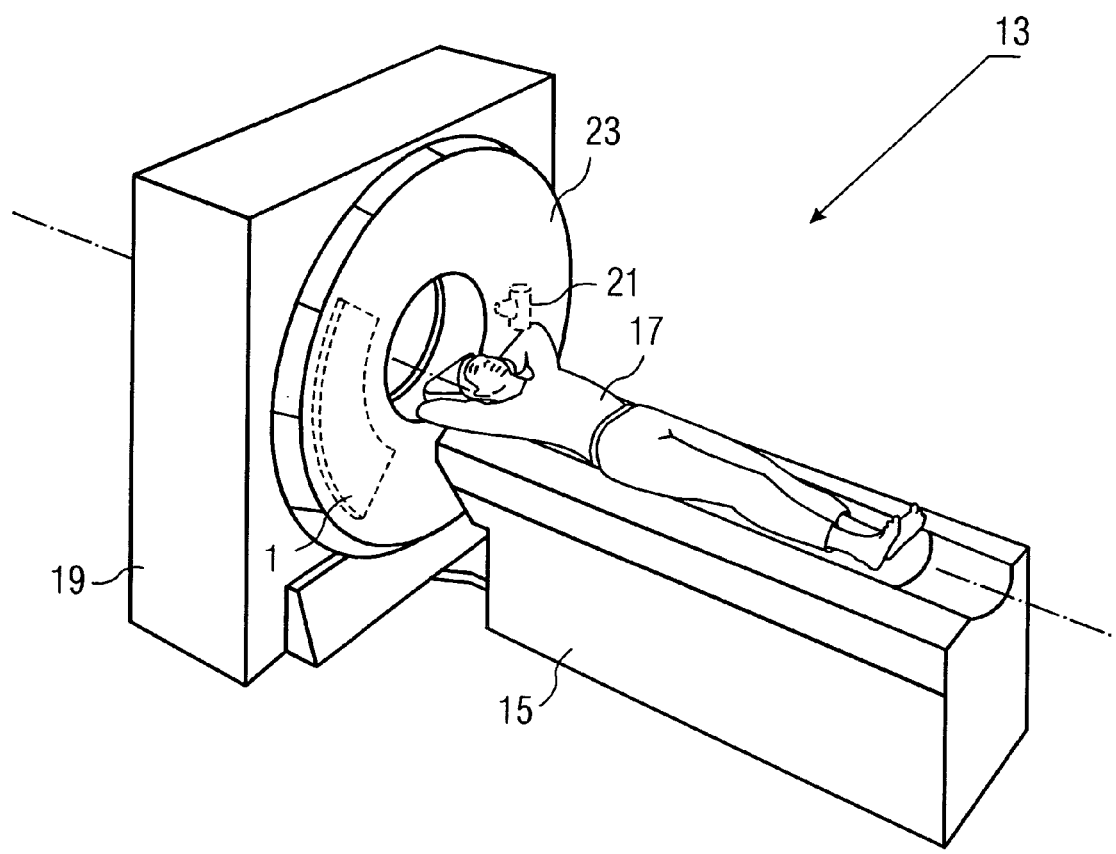
FIG. 3 shows a CT device with X-ray detector.

FIG. 3 shows a computer tomography device 13 having a gantry 23, inside which an X-ray source 21 and an X-ray detector 1 rotate along an orbit opposite one another. For this purpose, the gantry 23 is mounted in a suitable way on a gantry pedestal 19. A patient 17 who is to be examined is lying on a patient bed 15, on which he can be moved into the examination opening of the gantry 23.

The X-ray detector 1 is illustrated diagrammatically and without further details in the figure. It has a layer structure as explained in one of the previous figures. Moreover, it is patterned in such a way that it has rows or arrays of individual detector pixels which are used to record in each case individual pixels of X-ray images.

The text which follows describes a process used to produce one of the layer structures described. In this process, the first step involves producing the ceramic phosphor layer 3. A conventional production process is used for this purpose, for example the layer is fired or sintered from a pulverulent mixture of its constituents.

In a subsequent step, the surface of the phosphor layer 3 is polished as finely as possible, in order to be made as smooth as possible. A smooth surface is crucial for the adhesion of the organic photodetector layer 9 which is to be applied in a subsequent step and for its homogenous detection properties. If an intermediate layer 7, which inter alia optimizes the layer adhesion, is applied in a likewise subsequent step, it is also possible under certain circumstances to dispense with the step of polishing the surface.

In a subsequent step, the bottom electrode 5 is produced on the phosphor layer 3. For this purpose, the material of the bottom electrode 5 is reactively or thermally evaporation-coated onto the phosphor layer 3. Evaporation-coating processes of this type are known to the person skilled in the art. This results in optimum joining of the two layers, which in turn ensures excellent optical transition properties between the layers. The layer applied by evaporation coating only changes the properties of the surface below to a negligible extent.

In a further step, an intermediate layer 7 can be applied to the bottom electrode 5. The material selected for an intermediate layer 7 of this type is a polymeric material for which a wide range of inexpensive, optimally controlled processing processes are available. It is preferable for the intermediate layer 7 to be applied either by way of a spin-coating process, in which the polymer is applied in liquid form to the base body and is finely distributed over it by rotation, or by a printing process, e.g. a flexographic printing process, in which the liquid polymer is rolled on by way of a flexible roll, or by way of a beam/jet process, in which the liquid polymer is printed on using a jet printer, or by an adhesive bonding process using optical adhesive, in which case the material is stuck on as a film, it being possible for the film to bear optimally against the layer below it, unlike with rigid layers.

In the next step, the organic photodetector layer 9 is applied to the bottom electrode 5 or, if present, to the intermediate layer 7, using the same processes as for the intermediate layer 7. If a small-molecule organic semiconducting photodetector material is used, it is also possible to use a reactive deposition process, such as chemical vapor deposition (CVD), or a physical deposition process, such as physical vapor deposition (PVD). In principle, however, the processes mentioned above are preferred, on account of the process outlay involved with these processes.

Finally, the top electrode 11 is applied to the photodetector layer 9. If the top electrode 11 includes a metallic material, it is evaporation-coated on thermally, for example by electron beam evaporation. On the other hand, if it includes an organic material, the same processes as used for the intermediate layer 7 and the organic photodetector layer 9 are once again suitable. If the top electrode 11 forms the end of the layer structure, it does not have to be transparent to radiation. In this case, the optical transmission properties are of no importance, and the top electrode can also be stuck on using conductive adhesive, in the form of a rigid layer.

In a slightly modified embodiment of the process, the order of the process steps is varied in that the intermediate layer 7 is applied to the phosphor layer 3 first, followed by the bottom electrode 5. In this embodiment, the sequence of the other process steps remains unchanged and polishing of the surface of the phosphor layer 3 remains optional on account of the intermediate layer 7.

The processes used are extremely easy compared to the processing of inorganic semiconductors, since there is no need for expensive layer production processes, such as physical vapor deposition (PVD) or chemical vapor deposition (CVD) processes. Furthermore, the layer structure is also extremely easy to pattern, since there is no need for expensive wet-chemical etching processes which greatly pollute the environment when patterning organic layers.

The layer structure with layers which are not inherently rigid and therefore bear successfully against one another and are directly joined to one another ensures a good optical transition from the phosphor layer 3 to the photodetector layer 9. The transition is as far as possible free of losses and therefore increases the efficiency of the X-ray detector 1. Moreover, in the case of an X-ray detector which is patterned to form individual pixels, the good optical transition reduces optical crosstalk between the individual pixels caused by reflections and refractions. The optical properties are also improved through the polishing of the surface of the phosphor layer.

The deposition of the individual layers, in particular of the photodetector layer 9, from a solution by way of a spinning or printing process or by using flexible films of small thickness, represents a significant proportion of the potential cost savings achieved with the layer structure. This makes it possible to use extremely small amounts of the materials.

Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. An X-ray detector for a CT device, comprising:
   a phosphor layer, adapted to generate electromagnetic radiation as a function of an occurrence of X-radiation; and
   a photodetector layer, adapted to detect electromagnetic radiation generated by the phosphor layer; wherein the phosphor layer includes ceramic material, the photodetector layer is joined to the phosphor layer, has a layer thickness of between 30 nm and 500 nm, inclusive, and includes organic material.

2. The X-ray detector as claimed in claim 1, wherein the ceramic material is at least one of $Gd_2O_2S$ and $CdWO_4$.

3. The X-ray detector as claimed in claim 2, wherein the organic material is a mixture of p-type polyparaphenylene-vinylene (PPV) and n-type fullerene-phenyl-C61-butoxy-methoxine (fullerene-PCBM).

4. The X-ray detector as claimed in claim 3, further comprising:
   an intermediate layer, arranged between the phosphor layer and the photodetector layer and joined to the phosphor layer and to the photodetector layer.

5. The X-ray detector as claimed in claim 4, wherein the intermediate layer includes a polymer.

6. The X-ray detector as claimed in claim 5, wherein the polymer is polyethylene-dioxy-thiophene-polystyrene sulfonate (PEDOT-PSS).

7. The X-ray detector as claimed in claim 2, further comprising:
   an intermediate layer, arranged between the phosphor layer and the photodetector layer and joined to the phosphor layer and to the photodetector layer.

8. The X-ray detector as claimed in claim 7, wherein the intermediate layer includes a polymer.

9. The X-ray detector as claimed in claim 8, wherein the polymer is polyethylene-dioxy-thiophene-polystyrene sulfonate (PEDOT-PSS).

10. The X-ray detector as claimed in claim 1, wherein the organic material is a mixture of p-type polyparaphenylene-vinylene (PPV) and n-type fullerene-phenyl-C61-butoxy-methoxine (fullerene-PCBM).

11. The X-ray detector as claimed in claim 10, further comprising:
    an intermediate layer, arranged between the phosphor layer and the photodetector layer and joined to the phosphor layer and to the photodetector layer.

12. The X-ray detector as claimed in claim 11, wherein the intermediate layer includes a polymer.

13. The X-ray detector as claimed in claim 12, wherein the polymer is polyethylene-dioxy-thiophene-polystyrene sulfonate (PEDOT-PSS).

14. The X-ray detector as claimed in claim 1, further comprising:
    an intermediate layer, arranged between the phosphor layer and the photodetector layer and joined to the phosphor layer and to the photodetector layer.

15. The X-ray detector as claimed in claim 14, wherein the intermediate layer includes a polymer.

16. The X-ray detector as claimed in claim 15, wherein the polymer is polyethylene-dioxy-thiophene-polystyrene sulfonate (PEDOT-PSS).

17. The X-ray detector as claimed m claim 1, wherein a bottom electrode is provided and includes an oxide.

18. The X-ray detector as claimed in claim 17, wherein the oxide is indium-doped tin oxide (ITO).

19. The X-ray detector as claimed in claim 17, further comprising a top electrode, joined to the photodetector layer.

20. The X-ray detector as claimed in claim 1, further comprising a top electrode, joined to the photodetector layer.

21. The X-ray detector as claimed in claim 20, wherein the top electrode includes at least one of a metal and a metal alloy.

22. The X-ray detector as claimed in claim 20, wherein the top electrode includes a conductive polymer.

23. A CT device comprising the X-ray detector as claimed in claim 1.

24. A process for producing an X-ray detector for a CT device including a phosphor layer, useable to generate electromagnetic radiation as a function of the occurrence of X-radiation, and a photodetector layer, useable to detect generated electromagnetic radiation, comprising:
producing the phosphor layer from a ceramic material; and
applying the photodetector layer, made from an organic material and having a layer thickness of between about 30 nm and about 500 nm, inclusive, to the phosphor layer via at least one of spinning processing, printing processing, beam/jet processing and sticking the photodetector layer on the phosphor layer as a film.

25. The process as claimed in claim 24, further comprising:
polishing a surface of the phosphor layer before applying the photodetector layer.

26. The process as claimed in claim 25, further comprising:
applying an intermediate layer to the phosphor layer via at least one of spinning processing, printing processing, beam/jet processing and sticking the photodetector layer on the phosphor layer as a film, before applying the photodetector layer.

27. The process as claimed in claim 24, further comprising:
applying an intermediate layer to the phosphor layer via at least one of spinning processing, printing processing, beam/jet processing and sticking the photodetector layer on the phosphor layer as a film, before applying the photodetector layer.

28. An X-ray detector, comprising:
means for generating electromagnetic radiation as a function of an occurrence of X-radiation, including a phosphor layer; and
means for detecting electromagnetic radiation generated by the phosphor layer, including a photodetector layer; wherein
the phosphor layer includes ceramic material,
the photodetector layer is joined to the phosphor layer, has a thickness of between 30 nm and 500 nm, inclusive, and includes organic material.

29. The X-ray detector as claimed in claim 28, wherein the ceramic material is at least one of $Gd_2O_2S$ and $CdWO_4$.

30. The X-ray detector as claimed in claim 28, wherein the organic material is a mixture of p-type polyparaphenylene-vinylene (PPV) and n-type fullerene-phenyl-C61-butoxy-methoxine (fullerene-PCBM).

31. The X-ray detector as claimed in claim 28, further comprising:
an intermediate layer, arranged between the phosphor layer and the photodetector layer and joined to the phosphor layer and to the photodetector layer.

32. The X-ray detector as claimed in claim 31, wherein the intermediate layer includes a polymer.

33. The X-ray detector as claimed in claim 32, wherein the polymer is polyethylene-dioxy-thiophene-polystyrene sulfonate (PEDOT-PSS).

34. A CT device comprising the X-ray detector as claimed in claim 28.

* * * * *